United States Patent
Schwab

(10) Patent No.: US 9,543,540 B2
(45) Date of Patent: Jan. 10, 2017

(54) OLED DEVICE AND MANUFACTURE THEREOF

(71) Applicant: KONINKLIJKE PHILIPS N.V., Eindhoven (NL)

(72) Inventor: Holger Schwab, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/375,279

(22) PCT Filed: Jan. 30, 2013

(86) PCT No.: PCT/IB2013/050788
§ 371 (c)(1),
(2) Date: Jul. 29, 2014

(87) PCT Pub. No.: WO2013/114295
PCT Pub. Date: Aug. 8, 2013

(65) Prior Publication Data
US 2015/0008415 A1    Jan. 8, 2015

Related U.S. Application Data

(60) Provisional application No. 61/594,434, filed on Feb. 3, 2012.

(51) Int. Cl.
*H01L 51/52* (2006.01)
*H01L 51/00* (2006.01)
*H01L 51/56* (2006.01)

(52) U.S. Cl.
CPC ....... *H01L 51/5234* (2013.01); *H01L 51/0023* (2013.01); *H01L 51/5215* (2013.01); *H01L 51/5253* (2013.01); *H01L 51/56* (2013.01)

(58) Field of Classification Search
CPC ............. H01L 51/0545; H01L 51/0036; H01L 51/0541; H01L 27/1214; H01L 51/56; B82Y 10/00; B82Y 30/00; Y02E 10/50
See application file for complete search history.

(56) References Cited

U.S. PATENT DOCUMENTS

| 6,911,666 B2 | 6/2005 | Voutsas |
| 2003/0127650 A1* | 7/2003 | Park et al. ...................... 257/72 |

(Continued)

FOREIGN PATENT DOCUMENTS

| WO | 2008068293 A1 | 6/2008 |
| WO | 2009007899 A1 | 1/2009 |

*Primary Examiner* — Michelle Mandala

(57) ABSTRACT

A method of manufacturing an OLED device, a semi-finished product, and a OLED are described herein. In one embodiment, the method comprises providing an electrically conductive carrier substrate with a first carrier surface and a second carrier surface, assembling at least the first carrier surface a patterned layer of insulating material over an integral area, the layer of insulating material being patterned by a plurality of holes such that an electric access to the first carrier surface is possible, assembling a patterned conductive coating on the insulating material such that the conductive coating enters the holes and covers the insulating material, whereby the conductive coating is patterned such that a number of discrete first electrode areas are formed in the conductive coating, applying an organic light-emitting layer above at least one first electrode area, applying a second electrode layer above the organic light emitting layer.

17 Claims, 2 Drawing Sheets

(56) References Cited

U.S. PATENT DOCUMENTS

2005/0121669 A1* 6/2005 Kobayashi ................. 257/40
2008/0309233 A1* 12/2008 Hasegawa et al. ........... 313/505
2010/0259166 A1 10/2010 Cok et al.
2011/0285273 A1 11/2011 Albrecht et al.
2013/0087824 A1 4/2013 Van Den Brand et al.

* cited by examiner

OLED DEVICE AND MANUFACTURE THEREOF

CROSS-REFERENCE TO PRIOR APPLICATIONS

This application is the U.S. National Phase application under 35 U.S.C. §371 of International Application No. PCT/IB13/050788, filed on Jan. 30, 2013, which claims the benefit of U.S. Provisional Patent Application No. 61/594,434, filed on Feb. 3, 2012. These applications are hereby incorporated by reference herein.

FIELD OF THE INVENTION

The invention describes a method of manufacturing an OLED device. It also concerns a semi-finished product for the production of an OLED device and an OLED device.

BACKGROUND OF THE INVENTION

OLED devices on the one hand and inorganic electroluminescent devices on the other hand, i.e. organic electroluminescent films on the one hand and inorganic electroluminescent films on the other hand, are based on the effect that a light-emitting layer between two electrode layers is electrically stimulated by the electrode layers to emit light. In inorganic electroluminescent films the two electrodes are electrically insulated from each other and function as the two halves of a capacitor. When applying an alternating voltage to this capacitor it emits an electric field which stimulates the light-emitting layer to emit light. In contrast, in OLED devices, i.e. organic electroluminescent films, a direct current flows from one electrode to the other, thereby passing through the light-emitting layer which then, again, emits light.

The construction of OLED devices is generally a time-consuming process which needs a high precision of application steps of different functional layers such as the two electrodes (anode and cathode) and the organic light-emitting layer. The OLED device must be properly sealed against outside influences in order to achieve a sufficient lifetime and it must be assembled on a carrier which is sufficiently moisture-resistant and stable. Preferably, this carrier is flexible in order to provide for an overall flexible OLED device. This firstly has the advantage that the OLED device is considerably thin so that it can be applied in all such environments in which larger thicknesses of lighting solutions must be avoided. Secondly, a flexible OLED device can also be applied in such circumstances in which the OLED device is not arranged along a purely even plane, but rather along a curved plane or the like.

One possible solution to realize a flexible carrier substrate would be to use a metal film or foil as shown in U.S. Pat. No. 6,911,666 B2. However, this has a major drawback which needs to be circumvented for operational reasons of the OLED: metal films or foils can generally be characterized as conductive substrates which means that their own conductivity may dangerously interfere with other functional layers of the OLED device such as the ones named above. In essence, the electrical conductivity of such conductive carrier substrate may lead to short circuits. As both the anode and the cathode need to be electrically contacted via contact pads on the carrier substrate, one needs to realize a contact pad for one of the electrodes which is galvanically insulated from the other electrode.

This can either be realized by applying a non-conductive coating to the top of the conductive carrier substrate over the complete surface of the carrier substrate plus separated conductive coatings on top of the non-conductive coating or by locally depositing an insulating material in the area of one electrode contact pad. In the first case, the current can only be drawn across the non-conductive coating layer—in other words the conductivity of the carrier substrate is not used for transporting current. This solution also limits the choice of materials and leads to rather thick layer structures for large area OLED devices. In the second case, an inorganic material needs to be deposited as the contact pad on the insulating material needs to be in contact with the inner electrode of the OLED device and with an external power supply—which means the contact pad crosses the encapsulation of the OLED device. A patterned deposition of such an insulating layer or a post patterning process is also costly and rather ineffective. Organic insulators cannot be used as the cannot act as a moisture barrier which thus would lead to operational defects of the OLED device rather quickly.

Therefore, it is an object of the invention to provide for a possibility of more effectively providing an OLED device with a conductive carrier substrate, in particular for producing it with less elaborate coating steps than previously necessary.

SUMMARY OF THE INVENTION

The object is achieved by the method of manufacturing an OLED device, by the semi-finished product for the production of the OLED device and by the OLED device described and claimed herein.

According to the invention, such above-mentioned method comprises at least the following steps:
a) providing an electrically conductive carrier substrate with a first carrier surface and a second carrier surface,
b) assembling at least the first carrier surface a patterned layer of insulating material over an integral area, preferably such that the complete first carrier surface is covered with the insulating material, the layer of insulating material being patterned by a plurality of holes such that an electric access to the first carrier surface is possible from an upper surface of the layer of insulating material facing away from the first carrier surface,
c) assembling a patterned conductive coating on the insulating material at its upper surface such that the conductive coating enters the holes and covers the insulating material over an integral area, whereby the conductive coating is patterned such that a number of discrete first electrode areas are formed in the conductive coating, whereby preferably the complete insulating material is essentially covered with the conductive coating,
d) applying an organic light-emitting layer above at least one first electrode area,
e) applying a second electrode layer above the organic light emitting layer.

The conductive carrier substrate may in fact comprise all possible materials, but preferably comprises a metal layer. Most preferred it is mainly or completely comprised of a metal film or metal foil which proves to be a particularly easy-to-handle base material usable as a carrier substrate as it constitutes a standard material which is available in virtually all strengths, from extremely thin (i.e. from 25 µm) to a thickness which provides for a solid, nearly inflexible (i.e. hardly bendable) carrier substrate. It is however preferred that the conductive carrier substrate is flexible so that the resulting OLED device can also be designed as a flexible OLED device. Such metal layer or film may for instance comprise aluminium.

As for the layer of insulating material applied at the first carrier surface, this layer preferably comprises an inorganic material, most preferably is an inorganic layer.

As for the definition of an integral area, thereby is meant one single area which (in the case of the insulating material) essentially covers the extension of the conductive carrier substrate, with possibly a small margin (i.e. up to 10% of the complete plane extension of the conductive carrier substrate) at its edges or which (in the case of the patterned conductive coating) essentially defines the maximum extension of a light-emitting area of the OLED device. It is preferred however, that the integral area of the insulating layer covers all of the first surface of the conductive carrier substrate.

The first electrode area is preferably realized as an anode of the OLED device, the second electrode layer thus as its cathode. This second electrode layer is disposed at least above the organic light emitting layer, which implies that it may also cover a larger area beyond the extension of the organic light emitting layer.

The same process may be carried out again analogously at the second surface of the carrier substrate so that a double-sided OLED device is manufactured, which emits light from the direction of both the first surface and the second surface.

In essence, this method provides an easy possibility of how to use a (standard) conductive carrier material in spite of its electrical conductivity and actually utilizing that conductivity for contact purposes. It thus makes possible to use the conductive carrier substrate as a contact region for power supply for the first electrode. Thereby, the plurality of holes makes it possible to feed the first electrode area with current at a plurality of feeding points. That provides for a more equal distribution of electric current all over the plane extension of the first electrode area. This is particularly important in an OLED device as current in fact flows from one electrode to the other through the organic light emitting layer. In contrast, in an inorganic electroluminescent film as mentioned above, the electric field can much more easily be produced by feeding the necessary AC voltage at any contact points of the two electrodes, no matter where: an equal light distribution can thus be achieved in inorganic electroluminescent virtually automatically. Therefore, the method according to the invention is particularly useful for the production of larger OLED devices of sizes such as 50×50 up to 300×300 mm.

The result of that process is an OLED device according to the invention, which comprises:
a) an electrically conductive carrier substrate with a first carrier surface and a second carrier surface,
b) a layer of insulating material coated on at least the first carrier surface over an integral area, preferably such that the complete first carrier surface is covered with the insulating material, whereby the layer of insulating material comprises a pattern with a plurality of holes such that an electric access to the first carrier surface is possible from an upper surface of the layer of insulating material facing away from the first carrier surface,
c) a conductive coating at the upper surface of the insulating material such that the conductive coating is entered into the holes and covers the insulating material over an integral area, preferably such that the complete insulating material is covered with the conductive coating, whereby the conductive coating comprises a pattern such that a number of discrete first electrode areas are formed in the conductive coating,
d) an organic light-emitting layer above at least one first electrode area,
e) a second electrode layer applied above the organic light emitting layer.

Additional layers, in particular contact layers, insulating layers etc. may be added according to the desired particular outlet of the OLED device.

The use of the standard conductive carrier substrate also makes it possible to produce a standard semi-finished product which then can be end-tailored according to particular needs, i.e. according to a particular design of an OLED device according to the invention. The semi-finished product can thus be prefabricated in larger amounts and then, smaller amounts of specific OLED device (according to the invention) can be produced based on that semi-finished product, for instance based on specific customer needs.

The invention thus also concerns a semi-finished product for the production of an OLED device comprising
a) an electrically conductive carrier substrate with a first carrier surface and a second carrier surface,
b) a layer of insulating material coated on at least the first carrier surface over an integral area, preferably such that the complete first carrier surface is covered with the insulating material, whereby the layer of insulating material comprises a pattern with a plurality of holes such that an electric access to the first carrier surface is possible from an upper surface of the layer of insulating material facing away from the first carrier surface,
c) a conductive coating at the upper surface of the insulating material such that the conductive coating is entered into the holes and covers the insulating material over an integral area, preferably such that the complete insulating material is covered with the conductive coating.

The conductive coating in this context (and generally within the context of the invention) is preferably a transparent or translucent conductive coating. This way it is possible to optically (particularly preferred: automatically) detect the holes in the insulating layer, which is highly preferred in order to use the detected pattern of holes as an orientation or register mark for later application and/or ablation and/or cutting steps. Alternatively, if an opaque conductive coating is applied, the position of the holes for the use as register marks can be detected by detecting irregularities in the surface of the conductive coating (due to the position of the holes). In case that is also not possible, the position of the holes can also defined by using a regular pattern of holes so that the position of any of these holes can be re-calculated by marking or remembering the position of one single hole (or indeed of a number of holes).

Possibly, more of the elements mentioned in the context of the OLED device according to the invention may also be part of the semi-finished product, depending on what exactly is considered to be standard elements which are necessary for the production of a large number of OLED devices which can then be based on that semi-finished product.

Accordingly, the method according to the invention is preferably realized by producing a semi-finished product in a process comprising at least steps a) and b) and assembling a conductive coating (8, 9) on the insulating material (5) at its upper surface (10) such that the conductive coating (8, 9) enters the holes (7) and covers the insulating material (5) over an integral area, which semi-finished product is later refined in a separate process. That separate process then comprises the remaining steps selected from steps c) to e).

The dependent claims and the following description disclose particularly advantageous embodiments and features of the invention. Features of the claims may be combined as appropriate to arrive at further embodiment. Features described in the context of one claim category can apply equally to another claim category.

According to a preferred embodiment, the assembling step b) comprises the steps of b1) coating at least the first carrier surface with the layer of insulating material over the integral area, b2) patterning the layer of insulating material by creating in it the plurality of holes, and/or whereby the assembling step c) comprises the steps of c1) applying the conductive coating to the insulating material at its upper surface such that the conductive coating enters the holes and covers the insulating material (5) over the integral area, c2) patterning the conductive coating such that the number of discrete first electrode areas are formed in the conductive coating.

Thus, one or both of steps b) and/or c) can be divided into substeps: step b) can comprise a first step b1) in which a coating is applied over the entire first surface (possibly with some margins at its edges). Such full coating step b1) is particularly easy to perform as a patterning of the insulating material during a coating process can be comparatively difficult. Rather, in this case, the patterning of the insulating material is done after the coating step b1) so that both steps, the coating step b1) and the patterning step b2) are both rather simple steps in themselves while a combined coating/patterning process would be more complicated though less time-consuming.

The same reasoning applies to the application of the conductive coating which can also be divided into two sub-steps in a similar manner as described with reference to the insulating material. Again, the patterning step c2) is a separate step from an application step c1) with the same positive effects such as an overall simplification and easier handling of each one of the steps c1) and c2).

It has proven to be particularly advantageous if patterning the conductive coating is carried out such that at least one discrete first electrode area is in galvanic contact with the conductive carrier substrate via a plurality of holes of the insulating material. This means that the first electrode area is not just fed with current via a single contact area, i.e. hole, but rather via a plurality of such contact areas. In particular, this is advantageous when larger OLED devices are produced as the result is a more homogenous light-emitting effect of such OLED device, and the larger the OLED device is, the more it is important to feed the electrodes over a larger area. According to another very advantageous embodiment of the invention, after patterning of the conductive coating gaps within the conductive coating are filled with an insulating material, preferably with a printed insulating material. These gaps which insulate the discrete first electrode areas result from patterning the conductive coating from the surrounding area which areas surround the first electrode areas along the plane defined by the conductive coating.

Thereby, the same insulating material can be used as before in step b), but also a printed insulating material different from the before-mentioned insulating material of step b) can be used: this is due to the fact that as it does not connect the outside of the OLED device with its inside, the insulating material which fills the conductive coating gaps does not necessarily need to be usable as a water barrier, which, in contrast, the insulating material applied on the first surface preferably does. Such additional insulating step has the advantage that once other (in particular: conductive) layers are disposed over the conductive coating, no electric connection will be present between discrete regions of the conductive coating. This simplifies the definition of light-emitting areas significantly.

Generally, it is necessary to electrically insulate the second electrode layer from the first electrode area and all those conductive layers that are in galvanic contact with the latter. For instance, this can be accomplished by cutting all layers of the OLED device along cutting lines defined by the pattern of the conductive coating, i.e. along the edges of a light-emitting area of the OLED device. This way, the second electrode layer is completely electrically insulated from the first electrode layer as it does not extend into such regions (along a main extension plane of the OLED device) in which it would be in contact with the conductive coating. In case such cutting is not desired, it is preferred that contacts between the conductive coating and the conductive carrier substrate are removed in such contact areas in which the conductive coating is in galvanic contact with the second electrode layer. For instance, the second electrode layer may extend (along a main extension plane of the OLED device) over the limits of the light-emitting layer in one direction while it extends only up the those limits of the light-emitting layer in the counterdirection. In such case, the contacts between the conductive coating and the conductive carrier substrate are preferably only removed in that region in which the second electrode extends over the limits of the light-emitting layer. If the second electrode layer extends (along a main extension plane of the OLED device) over the limits of the light-emitting layer in more than one direction, for instance even over the complete extension of the conductive coating, the contacts between the conductive coating and the conductive carrier substrate must be removed in all contact areas defined by holes that are not indirectly covered by the light-emitting layer. This embodiment is particularly advantageous in that it makes possible to contact the second electrode layer at virtually any location along its plane extension.

This way it is made sure that no short circuit occurs in which current directly flows from the conductive carrier substrate to the second electrode layer which would circumvent the flow of current via the organic light-emitting layer. Such circumvention would firstly have the result that no light emission in the organic light-emitting layer takes place and secondly that the OLED device is most likely destroyed altogether due to an overheating and destruction of some (the weakest) electrical connection within the entire OLED device.

In order to seal the gaps resulting from such removal of contacts between the conductive coating and the conductive carrier substrate, the areas in which the contacts have been removed are filled with an insulating material, preferably the same insulating material as used for the gaps within the conductive coating. This implies that it is preferred that the filling of the insulating material into the areas in which the contacts have been removed and into the gaps within the conductive coating is carried out in one combined filling step, which makes the filling process simpler and less time-consuming.

Preferably, the above-mentioned patterning step b2) and/or c2) comprise a laser patterning process or a photolithographic patterning process and/or an etching process. Thereby it can be assumed that laser patterning is particularly preferred for the step b2) as this makes it easier to produce very small hole diameters, whereas photolithography is particularly preferred step c2). This is mainly due to the fact that laser ablation produces some debris which might affect the production of layers above the conductive coating. Concerning the layer of insulating material, this debris effect is comparatively negligible as the holes which are produced are so small that the debris can easily be removed to a very large extent.

As for the size of the holes, patterning the layer of insulating material preferably comprises a patterning process resulting in holes with a diameter of up to 500 μm (which can be realized by a photolithographic process), preferably 200 μm, most preferred 50 μm (which is not distinguishable by the human eye). This means that very small holes are produced, just sufficient for a distribution of the electric current so that—as mentioned above—only little debris is produced in case of a laser patterning process and so that a very large part of the insulating material remains on the first carrier surface.

Generally, the holes in the insulating layer can be produced in both regular and irregular patterns. In order to produce a standard semi-finished product and also in order to guarantee an even distribution of current from the conductive carrier substrate into the first electrode area, it is preferred to realize regular patterns, so that patterning of the layer of insulating material comprises a patterning process with the holes being arranged in a generic distribution, i.e. with a repetitive pattern which is for instance symmetrical.

Furthermore, it has proven advantageous in order to provide a sufficient provision of electric current all over the first electrode area that the patterning of the layer of insulating material comprises a patterning process with the holes being arranged at a maximum distance between two adjacent holes of 30 mm, preferably 20 mm, most preferred 10 mm. The holes are thus sufficiently close to each other to supply each first electrode with current via a plurality of holes. In addition, the semi-finished product resulting from such (amongst others) patterning process can be used for many different applications rather than just for very a limited amount of end-tailored products.

As for the material of the conductive coating applied in step c), this preferably comprises indium tin oxide and/or antimonium oxide and/or zinc oxide and/or PEDOT:PSS (i.e. poly(3,4-ethylenedioxythiophene) poly(styrenesulfonate)). All these materials are from a rather well-established choice and can thus be supplied as standard products and applied with standard methods known well in the field of OLED device production.

There is no particularly high conductivity necessary for the conductive coating, because the supplied current is distributed over the complete plane of the conductive carrier substrate and then locally supplied via the holes. Therefore, any of the above-mentioned materials can be used, simply in dependence of what can be applied best (and possibly cheapest) under the given circumstances of surrounding materials. Because of the rather low conductivities necessary for the realization of the conductive coating, it is also sufficient to realize a rather thin conductive coating. Therefore, it is sufficient if the assembling step c) comprises a sputtering step, alternatively a screen printing step. Screen printing can provide for a thicker layer of the conductive coating but may be advantageous because it is a process which can easily be integrated into other process steps in the context of OLED manufacture.

Generally, the OLED device manufactured according to the method according to the invention may have additional layers. In particular, it is possible that an additional conductive layer, preferably comprising silver and/or aluminium and/or molybdenum, is disposed on the conductive carrier substrate and/or on the conductive coating and/or on the second electrode layer. Such additional conductive layer may determinedly increase the conductivity of any of these layers mentioned. The expression "disposed on" thereby includes a direct or indirect deposition of such conductive layer at any of both surfaces of the respective layer which is equipped with the additional conductive layer.

The OLED device can be manufactured as a single device with one discrete light-emitting area. It can also be produced on a conductive carrier substrate carrying several functionally independent OLED devices which can be separated later, i.e. an assembly of OLED devices with several panels side by side in an array of lines and possibly also columns. In this case, the method according to the invention can be further enhanced by cutting out discrete light-emitting areas the extensions of which are based on extensions of the respective first electrode areas are cut out of an array of several light-emitting areas after the steps a) to e).

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
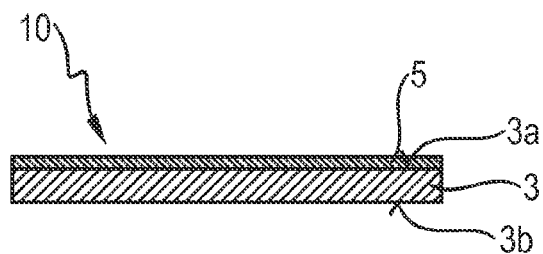
FIG. 1 shows a sectional view of a conductive carrier substrate as can be used in the context of the invention after a first step of a method according to the invention.
Figure 7:
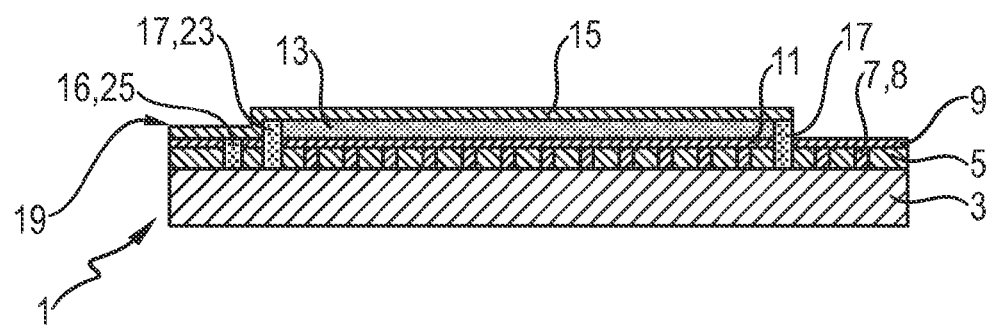
FIG. 7 shows a sectional view of an OLED device according to an embodiment of the invention.

FIG. 1 shows a conductive carrier substrate 3, here a metal film 3, which can be used to produce an OLED device according to an embodiment of the present invention. It comprises a first surface 3a and a second surface 3b which are opposite of each other. In a first step according to an embodiment of the method according to the invention a layer 5 of insulating material is assembled, i.e. supplied and disposed, on the first surface 3a. This insulating layer 5 will later serve as a first insulating part which insulates the conductive carrier substrate 3 from a second electrode layer (cf. FIG. 7). It has an upper surface 10 opposite the first surface 3a of the metal film 3.

Figure 2:
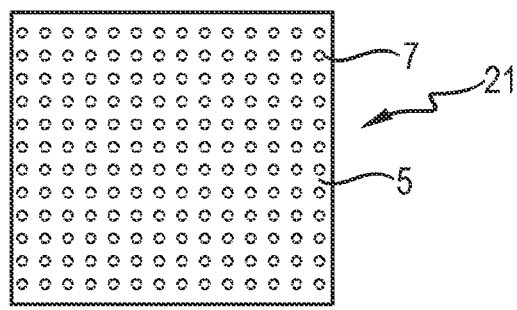
FIG. 2 shows a top view of a semi-finished product according to an embodiment of the invention realized after a second step of an embodiment of the method according to the invention.
Figure 3:
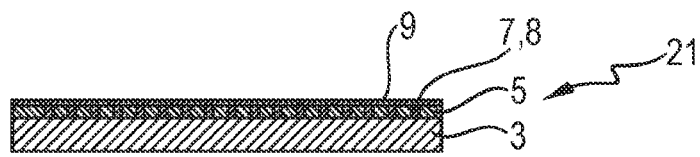
FIG. 3 shows a sectional view of the same semi-finished product after a third step of a method according to an embodiment of the invention.
Figure 4:
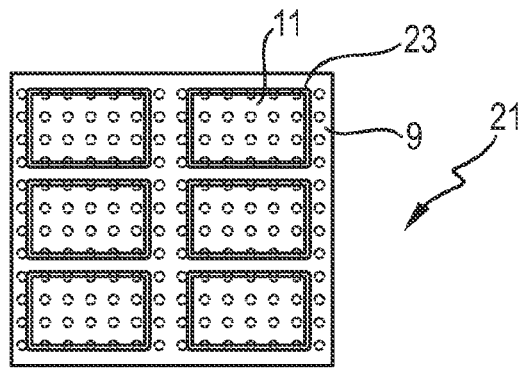
FIG. 4 shows a top view of the semi-finished product after a fourth step of a method according to an embodiment of the invention.

In a second step—as can be seen in FIG. 2—a plurality of holes 7 is created in the insulating layer 5 (by laser ablation) in a repetitive pattern with equal distances of 10 mms from one hole 7 to the next in both a line direction and a column direction of the insulating layer 5. Therefrom results a generic distribution of holes 7. The conductive carrier substrate 3 together with the patterned insulating layer 5 constitute a semi-finished product 21 according to an embodiment of the invention which can be used as a basis for the production of an OLED device according to the invention. All the subsequent steps which are explained with reference to FIGS. 3 to 7 can thus be considered steps which do not necessarily need to take place directly after the production of the semi-finished product 21. Rather, they can also follow at a later time, i.e. at least some days later, possibly also weeks, months or even a year or more later. In addition, different OLED devices for different purposes can be produced based on the same semi-finished product 21. It may be noted in this context, that more of the steps which are explained with reference to the following figures can also be part of the production of a semi-finished product 21. This is most preferably the case with reference to the step explained in the context of FIG. 3:

Here, in a third step, a conductive coating 9 is assembled at the upper surface 10 of the insulating layer 5, for instance by screen printing. Thereby, the material of the conductive coating 9 also flows inside the holes 7 of the insulating layer 5 so that inside the holes 7 there are conductive contacts 8 between the conductive carrier substrate 3 and the conductive coating 9.

In a fourth step, the conductive coating 9 is patterned by a photolithograhic patterning process: Therefrom result several discrete first electrode areas 11 or anodes 11 divided from the rest of the conductive coating 9 by gaps 23. It can be seen that any of the anodes 11 covers an area in which (underneath the conductive coating 9) several holes 7 are aligned. This means that several holes 7 feed each anode 11 with current from the conductive carrier substrate 3 below.

Figure 5:
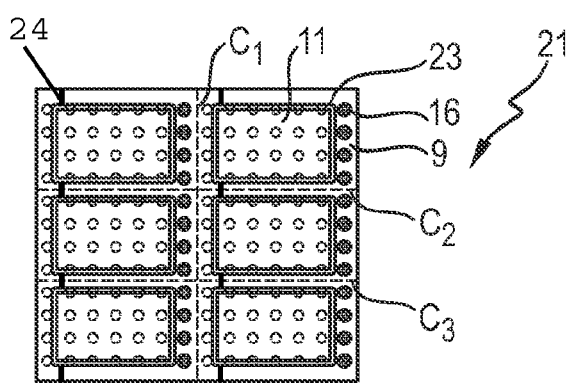
FIG. 5 shows a top view of the semi-finished product of FIG. 4 after a fifth step of a method according to an embodiment of the invention.
Figure 6:
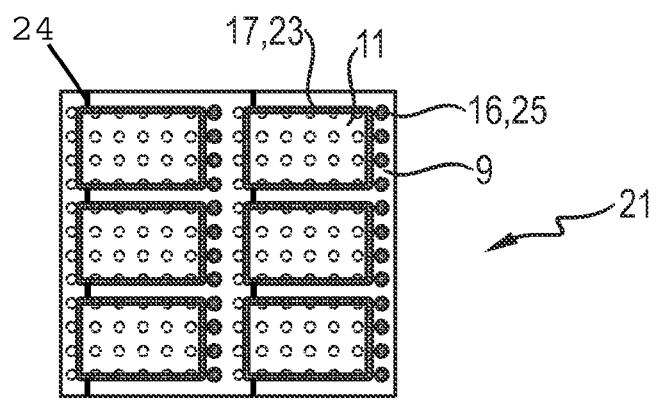
FIG. 6 shows a top view of the semi-finished product of FIG. 5 after a sixth of a method according to an embodiment of the invention.

FIG. 5 depicts the semi-finished product 21 after a fifth step in the context of an embodiment of the method according to the invention. Some of the conductive contacts 8 between the conductive coating 9 and the conductive carrier substrate 3 have been removed by removing all material in the region of selected holes 7 down to the conductive carrier substrate 3. Therefrom result channels 16 which are slightly larger in diameter than the holes 7 in the region of which the channels 16 have been produced. The channels 16 locally eliminate the electrically conductive connection between the conductive carrier substrate 3 and the conductive coating 9. The first electrode areas 11 are electrically isolated from surrounding area separated by the gaps if all conductive contacts 8 outside the first electrode areas 11 have been removed by means of channels 16. In the case that there are still remaining conductive contacts 8 electrically contacting the conductive carrier substrate 3 and the conductive coating 9 as shown in FIG. 5 additional isolation gaps 24 have to be added in order to electrically isolate at least parts of the conductive coating from the conductive carrier substrate when single OLED devices are cut along the cutting lines $C_1$, $C_2$, $C_3$ as discussed below. The isolation gaps can, for example, be processed in step 4 together with gaps 23 or in a separate step. In a sixth step as shown in FIG. 6 these channels 16 together with the gaps 23 and isolation gaps are filled with another insulating material 17, 25. This insulating material insulates the anodes 11 from the rest of the conductive coating and also provides insulated channels 16, the effect of which can be shown with reference to FIG. 7:

Here, in a seventh and a subsequent eighth step the semi-finished product 21 has been enhanced into an OLED device 1 according to an embodiment of the invention. On top of the anode 11 an organic light-emitting layer 13 has been applied which is bordered by the gap 23 with the insulating material 17. On top of that light-emitting layer 13 there has further been applied a second electrode layer 15 or cathode 15 which partly covers the conductive coating 9 (at the left-hand side) and (at the right-hand side) spreads up to the insulation 17 of the gap 23. In the region in which the cathode 15 is in direct contact with the conductive coating 9, the connection to the conductive carrier substrate 3 is sealed off due to the insulated channel 16. This end region 19 serves as a contact region for electrically contacting the cathode 15 of the OLED device 1.

Referring once again to FIG. 5, there can also be seen a number of cutting lines $C_1$, $C_2$, $C_3$. These serve to define the borders of a single OLED device 1 which can be cut out of the array of OLED devices as produced here. Once cuts are made along these cutting lines, six OLED devices 1 of the kind shown in FIG. 7 can be produced.

Although the present invention has been disclosed in the form of preferred embodiments and variations thereon, it will be understood that numerous additional modifications and variations could be made thereto without departing from the scope of the invention. For example, an OLED device according to the invention may comprise many more layers. In addition, the contact regions for electrically contacting the OLED device 1 with an AC source can be defined at any selected spot of the anode (and conductive carrier substrate) and cathode wherever is suitable for the operation of the OLED device.

For the sake of clarity, it is to be understood that the use of "a" or "an" throughout this application does not exclude a plurality, and "comprising" does not exclude other steps or elements.

The invention claimed is:

1. A method of manufacturing an OLED device comprising the following steps:
   providing an electrically conductive carrier substrate in the form of a metal material having a first carrier surface and a second carrier surface,
   assembling at least on the first carrier surface a patterned layer of insulating material over an integral area, the layer of insulating material being patterned by a plurality of holes such that an electric access to the first carrier surface is possible from an upper surface of the layer of insulating material facing away from the first carrier surface,
   assembling a patterned conductive coating on the insulating material at the upper surface such that the conductive coating enters the holes and covers the insulating material over the integral area, wherein the conductive coating is patterned such that a number of discrete first electrode areas are formed in the conductive coating,
   applying an organic light-emitting layer above at least one first electrode area, wherein the majority of the organic-light emitting layer lies in a plane, wherein a plurality of said holes are disposed perpendicular to the plane and below said organic-light emitting layer,
   applying a second electrode layer above the organic light emitting layer.

2. The method according to claim 1, wherein the assembling on the first carrier surface comprises the steps of:
   coating at least the first carrier surface with the layer of insulating material over the integral area,
   patterning the layer of insulating material by creating in it the plurality of holes,
wherein assembling the patterned conductive coating comprises the steps of:
   applying the conductive coating to the insulating material at the upper surface such that the conductive coating enters the plurality of holes and covers the insulating material over the integral area, patterning the conductive coating such that the number of discrete first electrode areas are formed in the conductive coating.

3. The method according to claim 1, wherein the patterning of the conductive coating is carried out such that at least one discrete first electrode area is in electrical contact with the conductive carrier substrate via at least a portion of said plurality of holes of the insulating material.

4. The method according to claim 1, wherein after the patterning of the conductive coating, gaps within the conductive coating are filled with an insulating material.

5. The method according to claim 4, wherein contacts between the conductive coating and the conductive carrier substrate are removed in such contact areas in which the conductive coating is in electrical contact with the second electrode layer.

6. The method according to claim 5, wherein the areas in which the contacts have been removed are filled with an insulating material.

7. The method according to claim 2, wherein the patterning of the layer of insulating material comprises a laser patterning process or a photolithographic patterning process and/or an etching process.

8. The method according to claim 7, wherein the patterning the layer of insulating material results in said plurality of holes, wherein said plurality of holes have diameters of up to 500 μm.

9. The method according to claim 8, wherein the plurality of holes are arranged in a generic distribution.

10. The method according to claim 9, wherein the plurality of holes are arranged such that a maximum distance between adjacent holes of said plurality of holes is 30 mm, 20 mm, or 10 mm.

11. The method according to claim 10, wherein an additional conductive layer, is disposed on the conductive carrier substrate and/or on the conductive coating and/or on the second electrode layer.

12. The method according to claim 11, wherein a semi-finished product is produced in a process comprising at least the step of providing the electrically conductive carrier substrate and the step of assembling at least on the first carrier surface a patterned layer of insulating material over an integral area and assembling the conductive coating on the insulating material at the upper surface such that the conductive coating enters the plurality of holes and covers the insulating material over the integral area, wherein the semi-finished product is later refined in a separate process comprising the steps of assembling the patterned conductive coating on the insulating material, applying the organic light-emitting layer above at least one first electrode area, applying the second electrode layer above the organic light emitting layer.

13. The method according to claim 12, wherein the conductive coating is a transparent or translucent conductive coating.

14. The method according to claim 1, wherein the plurality of said holes are disposed perpendicular to the plane and below said organic-light emitting layer during said applying of the second electrode layer.

15. A method of manufacturing an OLED device comprising the following steps:

providing an electrically conductive carrier substrate in the form of a metal material having a first carrier surface and a second carrier surface, assembling at least on the first carrier surface a patterned layer of insulating material over an integral area, the layer of insulating material being patterned by a plurality of holes such that an electric access to the first carrier surface is possible from an upper surface of the layer of insulating material facing away from the first carrier surface, assembling a patterned conductive coating on the insulating material at the upper surface such that the conductive coating enters the holes and covers the insulating material over the integral area, wherein the conductive coating is patterned such that a number of discrete first electrode areas are formed in the conductive coating, applying at least one organic light-emitting layer above at least one first electrode area of said first electrode areas such that the majority of the at least one organic-light emitting layer lies in a plane and the at least one first electrode area is disposed perpendicular to the plane and below the at least one organic-light emitting layer, wherein a portion of the conductive coating forming said at least one first electrode area is in contact with said electrically conductive carrier substrate, applying a second electrode layer above the organic light emitting layer.

16. The method of claim 15, wherein the at least one first electrode area is disposed perpendicular to the plane and below the at least one organic-light emitting layer during said applying of the second electrode.

17. The method according to claim 2, wherein the patterning of the conductive coating comprises a laser patterning process or a photolithographic patterning process and/or an etching process.

* * * * *